(12) United States Patent
Kuo et al.

(10) Patent No.: US 6,630,725 B1
(45) Date of Patent: Oct. 7, 2003

(54) ELECTRONIC COMPONENT AND METHOD OF MANUFACTURE

(75) Inventors: Shun-Meen Kuo, Chandler, AZ (US); Darrel R. Frear, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/684,576

(22) Filed: Oct. 6, 2000

(51) Int. Cl.$^7$ ............................................. H01L 23/552
(52) U.S. Cl. .................. 257/659; 257/710; 257/698; 257/780; 257/738; 257/685; 257/660
(58) Field of Search ................................ 257/704, 713, 257/659, 660, 698, 778, 780, 738, 685, 678, 710, 707

(56) References Cited

U.S. PATENT DOCUMENTS

| | | | |
|---|---|---|---|
| 4,193,083 A | 3/1980 | Max ........................ 357/80 |
| 4,811,082 A | 3/1989 | Jacobs et al. .................. 357/80 |
| 4,920,454 A | 4/1990 | Stopper et al. ............. 361/398 |
| 5,323,051 A | 6/1994 | Adams et al. ............... 257/417 |
| 5,478,781 A | 12/1995 | Bertin et al. ................. 437/209 |
| 5,519,193 A | 5/1996 | Freiermuth et al. ......... 219/678 |
| 5,593,903 A | 1/1997 | Beckenbaugh et al. ......... 437/8 |
| 5,798,557 A | 8/1998 | Salatino et al. .............. 257/416 |
| 5,880,403 A * | 3/1999 | Czajkowski et al. ...... 174/35 R |
| 5,904,555 A | 5/1999 | Darbha et al. .............. 438/613 |
| 5,915,168 A | 6/1999 | Salatino et al. ............. 438/110 |
| 5,940,683 A | 8/1999 | Holm et al. ................... 438/23 |
| 5,946,555 A | 8/1999 | Crumly et al. .............. 438/125 |
| 6,008,070 A | 12/1999 | Farnworth ................... 438/114 |
| 6,064,114 A | 5/2000 | Higgins, III ................. 257/698 |
| 6,214,644 B1 * | 4/2001 | Glenn ........................ 438/107 |
| 6,373,130 B1 * | 4/2002 | Salaville ..................... 257/692 |

* cited by examiner

Primary Examiner—David L. Talbott
Assistant Examiner—Luan Thai

(57) ABSTRACT

An electronic component includes a substrate (210, 1510), a device (221, 222) supported by the substrate and including a first bond pad (223, 224, 225, 226), and a cap (231, 232, 631, 731, 732, 1531, 1532) overlying the substrate. The cap includes a second bond pad (241, 242, 243, 244) at an outside surface of the cap, a third bond pad (245, 246, 247, 248) at an inside surface of the cap and electrically coupled to the first bond pad, and an electrically conductive via (251, 252, 254, 751, 752, 753, 754) extending through the cap and electrically coupling together the second and third bond pads.

25 Claims, 7 Drawing Sheets

ELECTRONIC COMPONENT AND METHOD OF MANUFACTURE

FIELD OF THE INVENTION

This invention relates to electronics, in general, and to electronic components and methods of manufacture, in particular.

BACKGROUND OF THE INVENTION

Radio Frequency (RF) switches are used in a variety of wireless applications, including cellular telephones. An RF switch can be made of a gallium arsenide (GaAs) switch or a Micro-ElectroMechanical System (MEMS) switch. In general, at any given operating frequency, the MEMS switch has lower insertion loss and also higher RF isolation than the GaAs switch. Both of these characteristics enable the MEMS switch to have better RF performance than the GaAs switch.

A packaging process for the MEMS switch includes manufacturing MEMS devices on a silicon wafer, dicing the silicon wafer into dice, picking a package and placing it on a packaging surface, dispensing a die attach material onto the package, picking a die from the diced silicon wafer and placing it onto the die attach material on the package, wire bonding the die to the package, releasing the switch, and using solder to seal a lid onto the package. This packaging process has many problems including low manufacturing throughput, die damage from the picking and placing of the die, and die misalignment in the package. The resulting MEMS switch also has many problems including high parasitic inductance in the wire bonds.

Accordingly, a need exists for an electronic component that has superior RF performance characteristics including low insertion loss, high RF isolation, and low parasitic inductances. The method of manufacturing the electronic component should have high manufacturing throughput, minimal die damage due to die handling, and accurate die alignment.

BRIEF DESCRIPTION OF THE DRAWINGS

The invention will be better understood from a reading of the following detailed description, taken in conjunction with the accompanying drawing figures in which.

Figure 1:
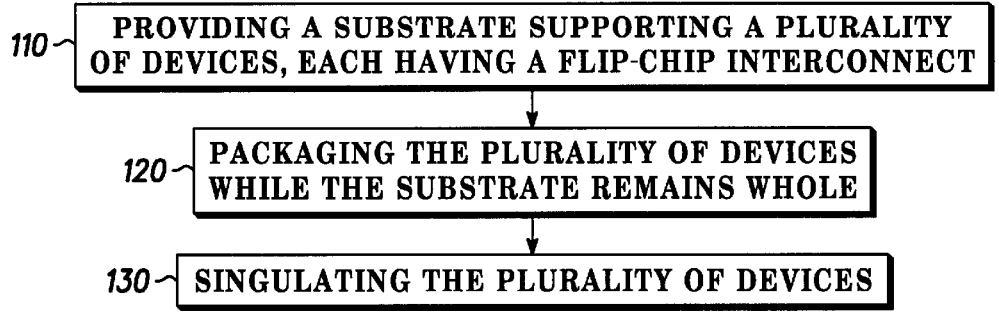
FIG. 1 illustrates a flow chart for a method of manufacturing electronic components in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in sequences other than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in orientations other than described or illustrated herein.

DETAILED DESCRIPTION OF THE DRAWINGS

FIG. 1 illustrates a flow chart 100 for a method of manufacturing electronic components. At a step 110 of flow chart 100 in FIG. 1, a substrate is provided. The substrate of step 110 supports a plurality of devices where each device preferably has a flip-chip interconnect or bond pad. Step 110 can be performed by purchasing a substrate that already supports the plurality of devices. In a different embodiment, step 110 can be performed by manufacturing the plurality of devices to be supported by the substrate.

Next, at a step 120 of flow chart 100 in FIG. 1, the plurality of devices are packaged while the substrate remains whole. Step 120 performs a wafer-level packaging process where the substrate forms the bottom of the package. A separate piece-part does not need to be used for the bottom of the package. Details of step 120 are explained in more detail hereinafter.

Subsequently, at a step 130 of flow chart 100 in FIG. 1, the plurality of devices are singulated. Step 130 occurs after step 120. Accordingly, the plurality of devices are singulated or separated from each other after being packaged.

FIGS. 2 through 5 illustrate cross-sectional views of electronic components 201 and 202 after different steps of a manufacturing process, such as the process illustrated by flow chart 100 in FIG. 1. Each of components 201 and 202 are formed partially from a single substrate 210. Substrate 210 can comprise a semiconductor layer and can also comprise dielectric and/or metal layers. In another embodiment, substrate 210 can consist solely of a single or multiple electrically insulative layers.

Each of components 201 and 202 comprise at least one device. In particular, component 201 comprises device 221, and component 202 comprises a device 222. As an example, devices 221 and 222 can be selected from the group consisting of a MEMS switch, a GaAs switch, an integrated circuit, a discrete transistor, and a chemical sensor. In the preferred embodiment, devices 221 and 222 are the same type of device, such as a micromachined, folded-spring MEMS RF device or switch.

Figure 2:
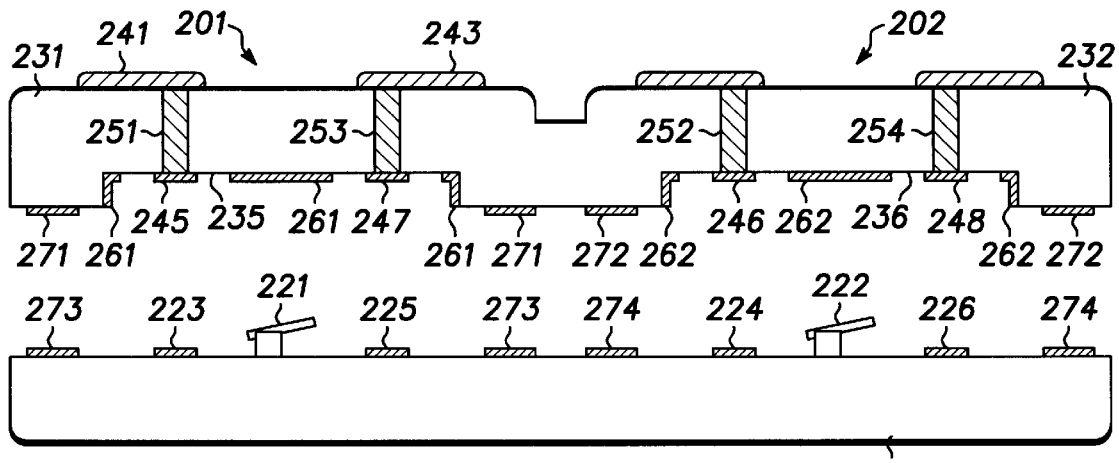
FIGS. 2 through 5 illustrate cross-sectional views of electronic components after different steps of a manufacturing process in accordance with an embodiment of the invention.

Devices 221 and 222 are supported by substrate 210, and each of devices 221 and 222 comprise at least one bond pad. As illustrated in FIG. 2, device 221 comprises bond pads 223 and 225, and device 222 comprises bond pads 224 and 226. In the preferred embodiment, bond pads 223, 224, 225, and 226 are identical electrically conductive flip-chip bond pads. Substrate 210 is preferably fashioned from semiconductor material though any suitable substrate material such as ceramic, alumina, etc., will suffice.

Each of components 201 and 202 further comprise a cap. In particular, component 201 comprises a cap 231, and component 202 comprises a cap 232. Caps 231 and 232 overlie substrate 210. Caps 231 and 232 also overlie devices 221 and 222, respectively. At the stage of the manufacturing process illustrated in FIG. 2, caps 231 and 232 are portions of a single or unitary piece.

Each of caps 231 and 232 are comprised of an electrically insulative material having an outside surface facing away from substrate 210 and an inside surface facing towards substrate 210. In particular, cap 231 has an outside surface 233 and an inside surface 235, and cap 232 has an outside surface 234 and an inside surface 236. The caps are preferably formed from ceramic material such as alumina but other suitable materials are available.

Each of caps 231 and 232 additionally comprise electrically conductive bond pads located at each of their respective outside and inside surfaces. In particular, cap 231 includes electrically conductive bond pads 241 and 243 at outside surface 233 and further includes electrically conductive bond pads 245 and 247 located at inside surface 235. Bond pads 245 and 247 are located over bond pads 223 and 225, respectively. Cap 232 includes electrically conductive bond pads 242 and 244 located at outside surface 234 and further includes electrically conductive bond pads 246 and 248 located at inside surface 236. Bond pads 246 and 248 are located over bond pads 224 and 226, respectively.

Each of caps 231 and 232 further comprise electrically conductive vias extending through the cap from their respective outside surfaces to their respective inside surfaces to electrically couple together bond pads located at their respective outside and inside surfaces. In particular, cap 231 includes an electrically conductive via 251 extending through cap 231 from outside surface 233 to inside surface 235 and electrically coupling together bond pads 241 and 245. Cap 231 additionally includes an electrically conductive via 253 extending through cap 231 from outside surface 233 to inside surface 235 and electrically coupling together bond pads 243 and 247. Similarly, cap 232 includes an electrically conductive via 252 extending through cap 232 from outside surface 234 to inside surface 236 and electrically coupling together bond pads 242 and 246. Cap 232 additionally includes an electrically conductive via 254 extending through cap 232 from outside surface 234 to inside surface 236 and electrically coupling together bond pads 244 and 248.

Inside surfaces 235 and 236 of caps 231 and 232, respectively, are both contoured or non-planar. Each of caps 231 and 232 have an Electro-Magnetic Interference (EMI) shield located at their respective non-planar inside surfaces. The EMI shields are electrically conductive and preferably are not electrically shorted to the bond pads. In a different embodiment, however, each EMI shield can be electrically coupled to a single bond pad. As illustrated in FIG. 2, cap 231 includes EMI shield 261, and cap 232 includes EMI shield 262. EMI shield 261 surrounds bond pads 245 and 247, and EMI shield 262 surrounds bond pads 246 and 248.

Each of caps 231 and 232 further comprise a bond pad for sealing the package. Cap 231 includes a bond pad 271, which is located at and preferably continuously encircles a perimeter of cap 231, and cap 232 includes a bond pad 272, which is located at and also preferably continuously encircles a perimeter of cap 232. Similarly, a bond pad 273 is located around and preferably continuously encircles a perimeter of a portion of substrate 210 that is a part of component 201, and a bond pad 274 is located at and preferably continuously encircles a perimeter of a portion of substrate 210 that is a part of component 202. Bond pad 273 is preferably electrically isolated from bond pads 223, 225, 245, and 247, and bond pad 274 is preferably electrically isolated from bond pads 224, 226, 246, and 248. Bond pads 223 and 225 are located between device 221 and bond pad 273. Similarly, bond pads 224 and 226 are located between device 222 and bond pad 274. EMI shields 261 and 262 are also preferably located within or surrounded by bond pads 273 and 274, respectively, and bond pads 271 and 272 respectively.

Figure 3:
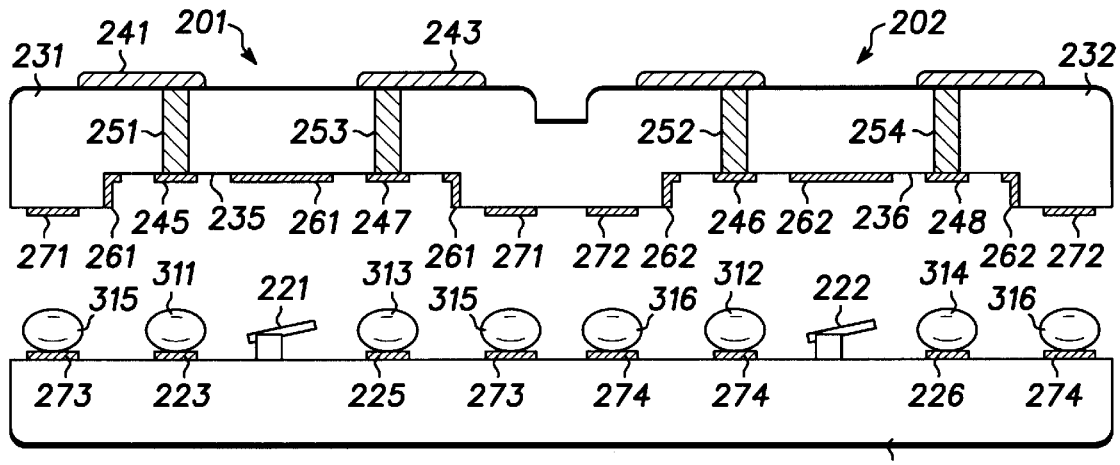

Turning to FIG. 3, an electrically conductive material is disposed to be located between bond pads supported by substrate 210 and bond pads of caps 231 and 232. In particular, portions 311, 313, 312, and 314 of the electrically conductive material are dispensed onto bond pads 223, 225, 224, and 226, respectively. In a different embodiment, the electrically conductive material can be dispensed onto the bond pads of caps 231 and 232 instead of onto the bond pads supported by substrate 210. In the preferred embodiment, each of portions 311, 313, 312, and 314 are substantially identical to each other in shape, size, and composition. Also in the preferred embodiment, the electrically conductive material is solder, and each of portions 311, 313, 312, and 314 is a solder ball.

Also illustrated in FIG. 3, an adhesive material is disposed to be located between other bond pads supported by substrate 210 and other bond pads of caps 231 and 232. In particular, portions 315 and 316 of the adhesive material is dispensed over bond pads 273 and 274, respectively. In a different embodiment, the adhesive material can be dispensed onto the bond pads of caps 231 and 232 instead of onto the bond pads supported by substrate 210. The adhesive material can be dispensed before, after, or simultaneously with the electrically conductive material. In the preferred embodiment, the adhesive material is comprised of the same material as the electrically conductive material to simplify the manufacturing process. In a different embodiment, the adhesive material can be electrically insulative.

The portions of the electrically conductive material and the portions of the adhesive material have different heights. In particular, the height of the electrically conductive material is greater than the height of the adhesive material because of the non-planar configuration of inner surfaces 235 and 236 of caps 231 and 232, respectively. In the preferred embodiment, the individual widths of portions 315 and 316 of the adhesive material are greater than the individual widths of portions 311, 313, 312, and 314 of the electrically conductive material. The widths of the portions of the electrically conductive material and the adhesive material are measured in a direction substantially parallel to the major surface of substrate 210 supporting devices 221 and 222. The greater widths of portions 315 and 316 of the adhesive material are used to ensure a reliable seal between caps 231 and 232 and substrate 210.

Next, caps 231 and 232, as a unitary piece, are aligned over substrate 210, devices 221 and 222, the electrically conductive material, and the adhesive material. In a different embodiment, substrate 210 can be aligned to caps 231 and 232, or caps 231 and 232 and substrate 210 can be aligned to each other.

Figure 4:
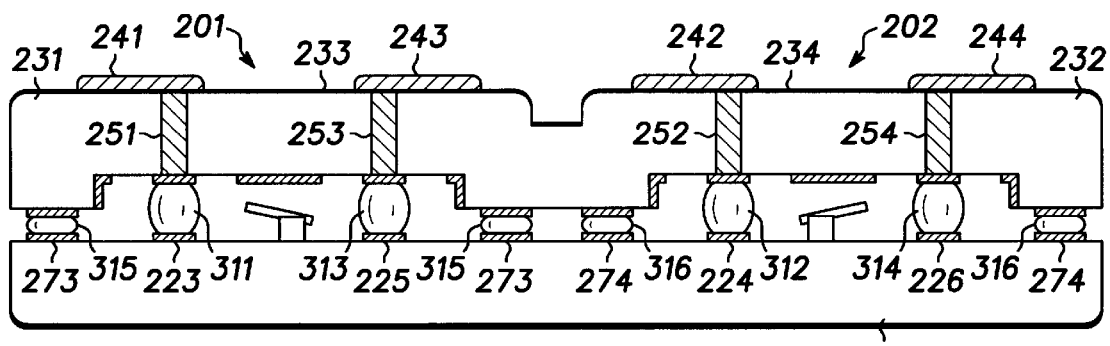

Continuing with FIG. 4, caps 231 and 232 are moved toward the electrically conductive material and the adhesive material to form a sealed package around or encasing devices 221 and 222. In a different embodiment, substrate 210 can be moved towards caps 231 and 232, or caps 231 and 232 and substrate 210 can be moved toward each other. After this step, in the preferred embodiment where the adhesive material and the electrically conductive material are both comprised of solder, the electrically conductive material and the adhesive material are reflowed. Also in the preferred embodiment, caps 231 and 232 can be self-aligned to substrate 210 due to the surface tension of the electrically conductive material and the adhesive material.

Portion 311 of the electrically conductive material is located between bond pads 245 and 223 to electrically couple together bond pads 245 and 223. Portion 313 of the electrically conductive material is located between bond pads 247 and 225 to electrically couple together bond pads 247 and 225. Similarly, portion 312 of the electrically conductive material is located between bond pads 246 and 224 to electrically couple together bond pads 246 and 224, and portion 314 of the electrically conductive material is located between bond pads 248 and 226 to electrically couple together bond pads 248 and 226. In the preferred embodiment, the electrically conductive material does not contact EMI shield 261 or 262.

Portion 315 of the adhesive material is located between bond pads 271 and 273 to form a seal between cap 231 and substrate 210. This seal physically isolates device 221 and portions 311 and 313 of the electrically conductive material from the environment outside of the package cavity. Similarly, portion 316 of the adhesive material is located between bond pads 272 and 274 to form a seal between cap 232 and substrate 210. This seal physically isolates device 222 and portions 312 and 314 of the electrically conductive material from the environment outside of the package cavity. In the preferred embodiment, the adhesive material does not contact EMI shields 261 or 262.

Figure 5:
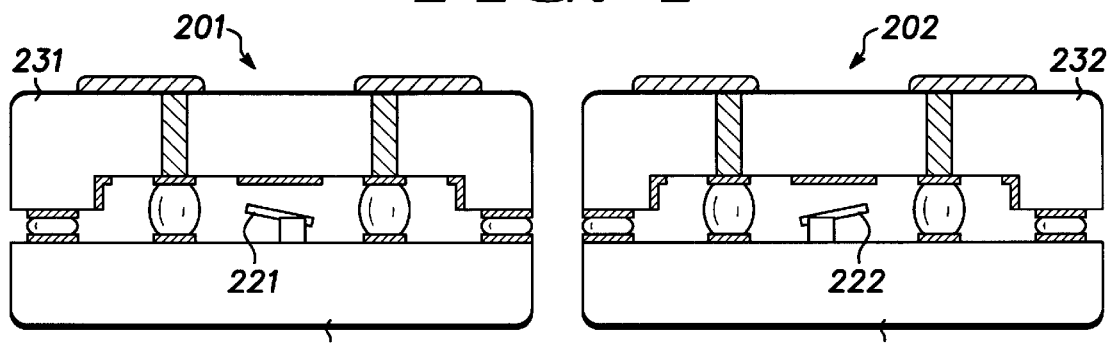

Continuing with FIG. 5, components 201 and 202 are singulated or separated from each other. As an example, a mechanical sawing technique can be used to singulate components 201 and 202. In this embodiment, the sawing process cuts through substrate 210 and caps 231 and 232. In a different embodiment, substrate 210 and caps 231 and 232 can each be scribed or partially cut through, and then a breaking process can be used to finally separate components 201 and 202 from each other. Although the process illustrated in FIGS. 2 through 5 shows only two components supported by substrate 210, one skilled in the art will understand that substrate 210 can be larger to manufacture many more than only two components. In this different embodiment, many more caps will be connected together to perform the wafer-level packaging.

Figure 6:
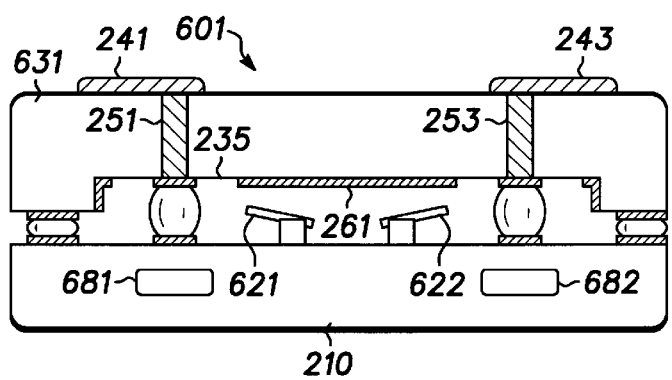
FIG. 6 illustrates a cross-sectional view of an electronic component in accordance with an alternative embodiment of the invention.

FIG. 6 illustrates a cross-sectional view of an electronic component 601. Component 601 is an alternative embodiment of components 201 and 202 in FIG. 5. Component 601 includes substrate 210 and a cap 631, which is similar to caps 231 and 232 of components 201 and 202, respectively, in FIG. 5. Cap 631 in FIG. 6, however, can be larger than either of caps 231 or 232 in FIG. 5.

Component 601 comprises two devices 621 and 622, each of which can be similar to devices 221 and 222 of components 201 and 202, respectively, in FIG. 5. In this embodiment, cap 631 will have a larger size and will also likely have more bond pads than caps 231 or 232 in FIG. 5.

Component 601 can additionally include optional circuits 681 and 682 supported by substrate 210. Circuits 681 and 682 can be integrated circuits for control and/or power supply circuitry. When optional circuits 681 and 682 are present, substrate 210 is comprised of semiconductor, metal, and dielectric layers. The addition of circuits 681 and 682 will further increase the size of cap 631 and the number of bond pads in cap 631.

Figure 7:
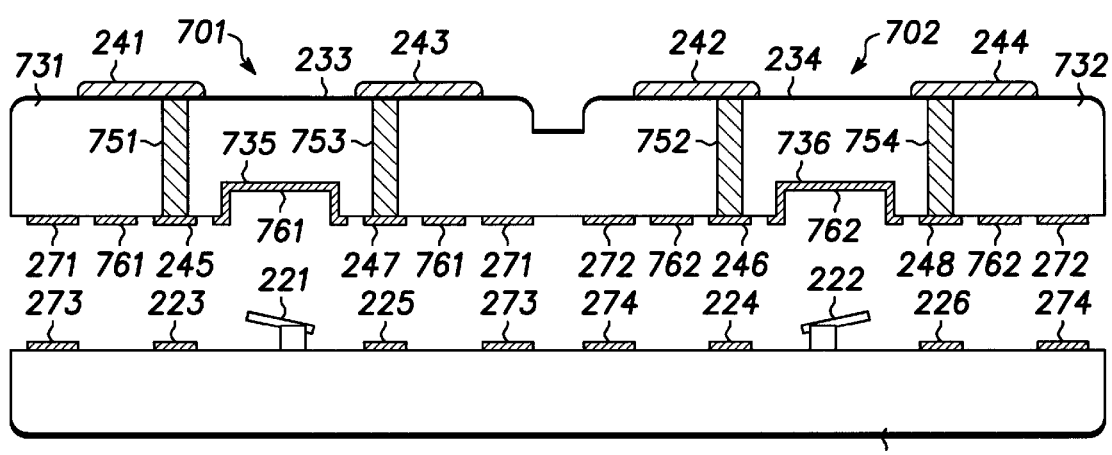
FIGS. 7 through 10 illustrate cross-sectional views of electronic components after different steps of a different manufacturing process in accordance with a different embodiment of the invention.

FIGS. 7 through 10 illustrate cross-sectional views of electronic components 701 and 702 after different steps of a different manufacturing process. FIG. 7 illustrates components 701 and 702, which are similar to components 201 and 202, respectively, of FIG. 2. Component 701 is comprised of a portion of substrate 210 and a cap 731, and component 702 is comprised of a different portion of substrate 210 and a cap 732. Caps 731 and 732 are similar to caps 231 and 232, respectively, of FIG. 2. At this stage of the manufacturing process, caps 731 and 732 are connected together to form a single or unitary piece.

Similar to cap 231 in FIG. 2, cap 731 in FIG. 7 is comprised of an electrically insulative material having outer surface 233. Cap 731 also has an inner surface 735 that has a different configuration from inner surface 235 of FIG. 2, but is still non-planar. Similarly, cap 732 of FIG. 7 is comprised of an electrically insulative material and has outer surface 234. Cap 732 also has an inner surface 736 that has a different configuration from inner surface 236 of FIG. 2.

Cap 731 includes electrically conductive vias 751 and 753, which are similar to vias 251 and 253 in FIG. 2. Electrically conductive via 751 extends from outer surface 233 of cap 731 to an inner surface 735 of cap 731 to electrically couple together bond pads 241 and 245. Electrically conductive via 753 extends from outer surface 233 of cap 731 to inner surface 735 of cap 731 to electrically couple together bond pads 243 and 247.

Cap 732 comprises electrically conductive vias 752 and 754, which are similar to electrically conductive vias 252 and 254 of FIG. 2. Electrically conductive via 752 extends from outer surface 234 of cap 732 to inner surface 736 of cap 732 to electrically couple together bond pads 242 and 246. Electrically conductive via 754 extends from outer surface 234 of cap 732 to inner surface 736 of cap 732 to electrically couple together bond pads 244 and 248.

Caps 731 and 732 further comprise EMI shields 761 and 762, respectively. EMI shield 761 surrounds bond pads 245 and 247, and EMI shield 762 surrounds bond pads 246 and 248.

Figure 8:
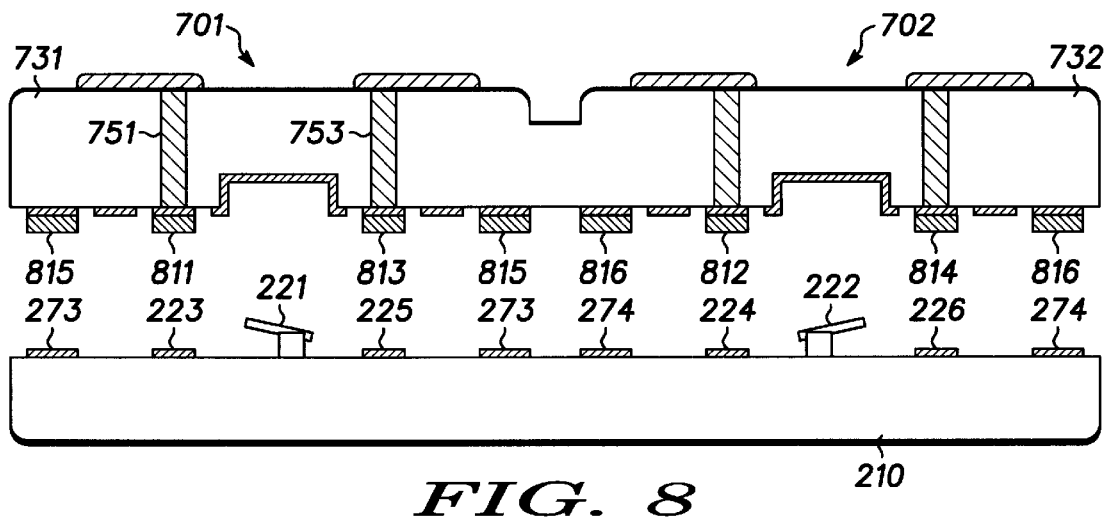

Turning to FIG. 8, portions 811, 813, 812 and 814 of an electrically conductive material are screen printed onto bond pads of caps 731 and 732. Portions 815 and 816 of an adhesive material are also screen printed onto other bond pads of caps 731 and 732. In the preferred embodiment, the electrically conductive material and the adhesive material are comprised of the same material, namely solder. Also in the preferred embodiment, the electrically conductive material and the adhesive material are screen printed simultaneously with each other. In a different embodiment, the electrically conductive material and the adhesive material can be screen printed onto the bond pads supported by substrate 210. In another embodiment, the electrically conductive material and the adhesive material can be plated, dispensed, or pre-formed.

As illustrated in FIG. 8, the widths of the individual portions of adhesive material are larger than the widths of the individual portions of the electrically conductive material for the same reasons as explained earlier with reference to FIG. 3. Due to the configuration of inner surfaces 735 and 736 of caps 731 and 732 in FIG. 8 and the location of the bond pads at inner surfaces 735 and 736, the heights of the adhesive material and the electrically conductive material are preferably the same or at least similar.

Figure 9:
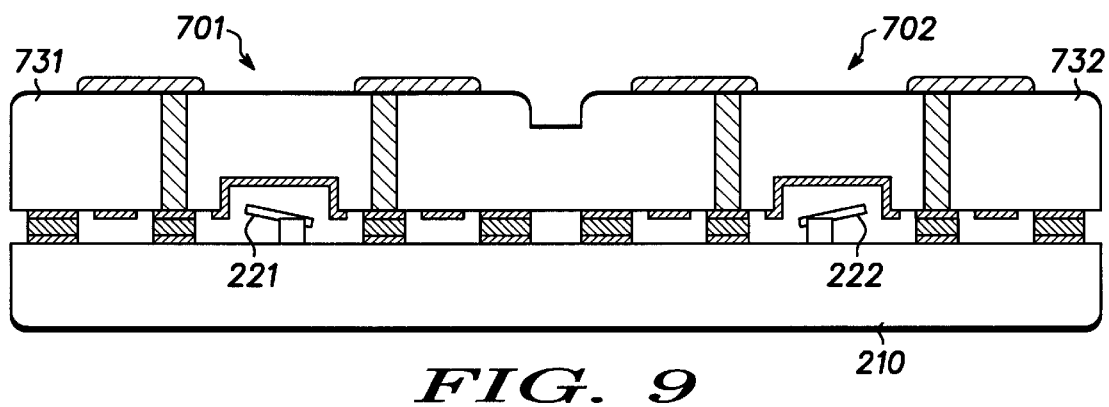
Figure 10:
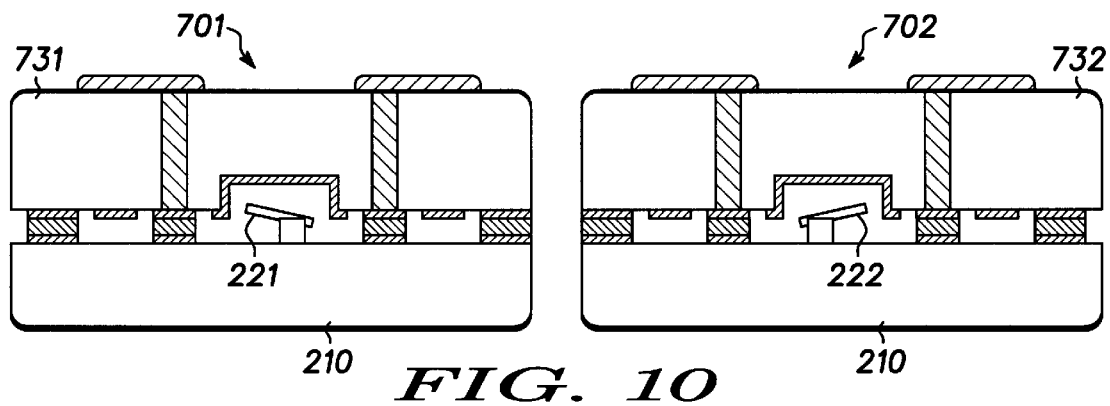
Figure 11:
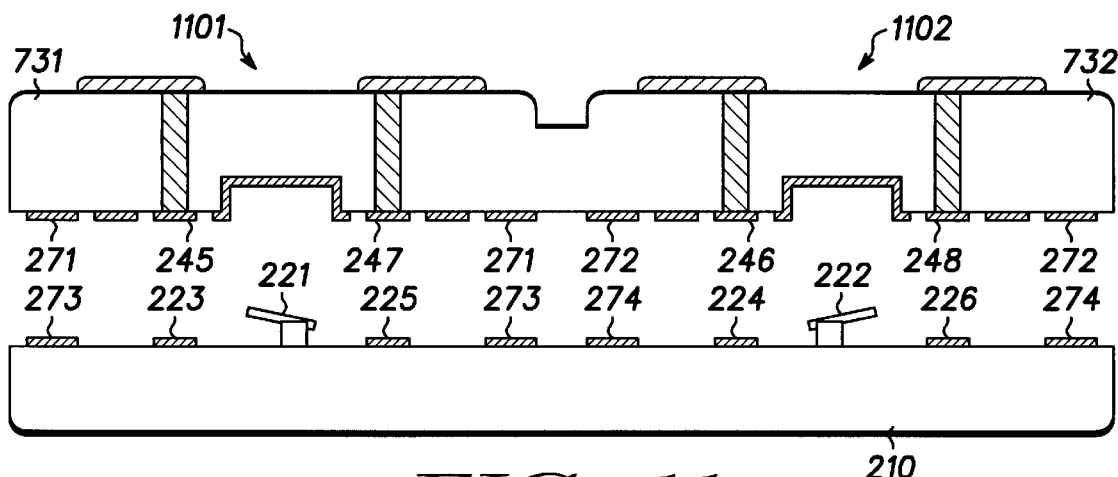
FIGS. 11 through 14 illustrate cross-sectional views of electronic components after different steps of another manufacturing process in accordance with another embodiment of the invention.

Continuing with FIG. 9, device 221 is packaged or sealed between cap 731 and substrate 210, and device 222 is simultaneously packaged or sealed between cap 732 and substrate 210. Turning to FIG. 10, components 701 and 702 are singulated in a process as earlier discussed.

FIGS. 11 through 14 illustrate cross-sectional views of electronic components 1101 and 1102 after different steps of another manufacturing process. Components 1101 and 1102 are similar to components 701 and 702 of FIGS. 7 through 10. For example, components 1101 and 1102 include caps 731 and 732, respectively, and also include portions of substrate 210. In a different embodiment of components 1101 and 1102, bond pads 271, 272, 273, and 274 can be eliminated.

Figure 12:
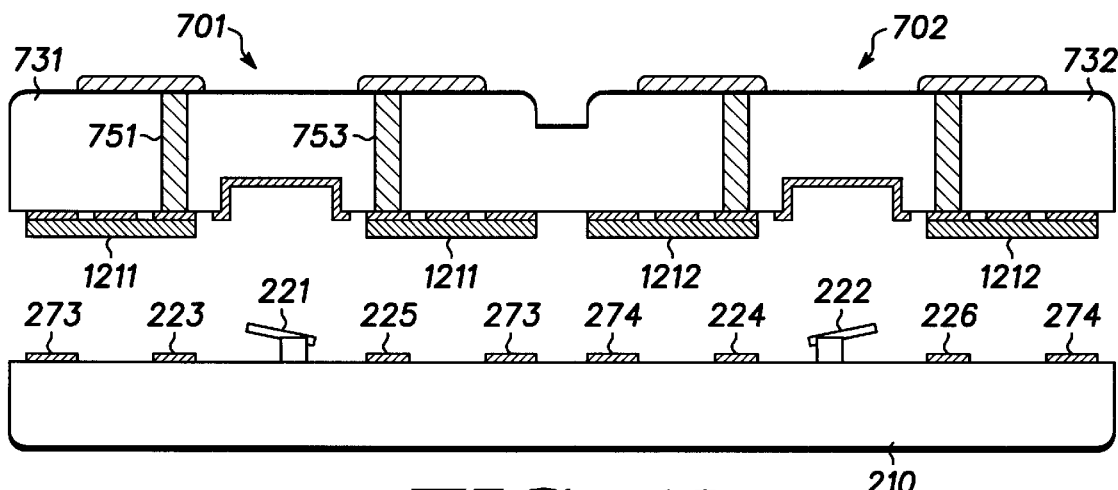

Components 1101 and 1102, however, use a single or unitary piece of material for the electrically conductive material and the adhesive material of components 701 and 702 in FIGS. 8 through 10. As illustrated in FIG. 12, components 1101 and 1102 include portions 1211 and 1212, respectively, of an adhesive and electrically conductive material. In the preferred embodiment, this adhesive and electrically conductive material is an organic Anisotropic Conductive Film (ACF) material. This ACF material is electrically conductive only in one direction, namely along the Z-axis, which is substantially perpendicular to the major surface of substrate 210 that supports devices 221 and 222. This ACF material is attached to the bond pads of caps 731 and 732. In a different embodiment, the ACF material can be attached to the bond pads supported by substrate 210.

Figure 13:
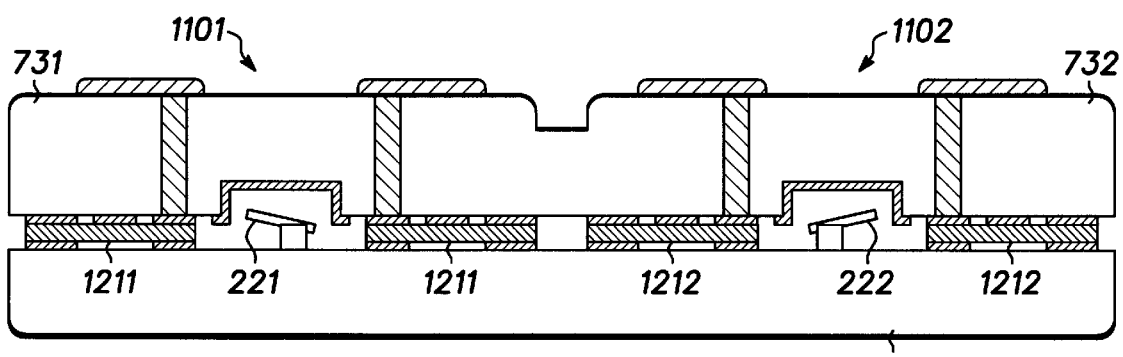
Figure 14:
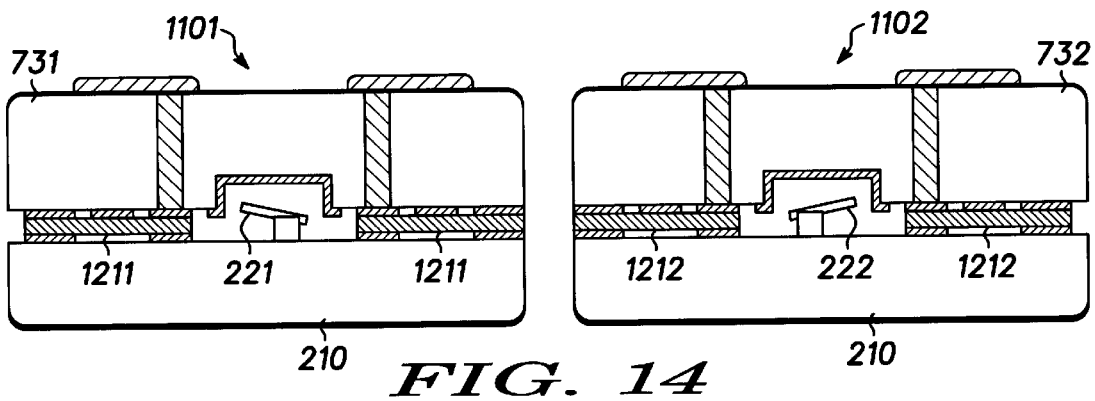
Figure 15:
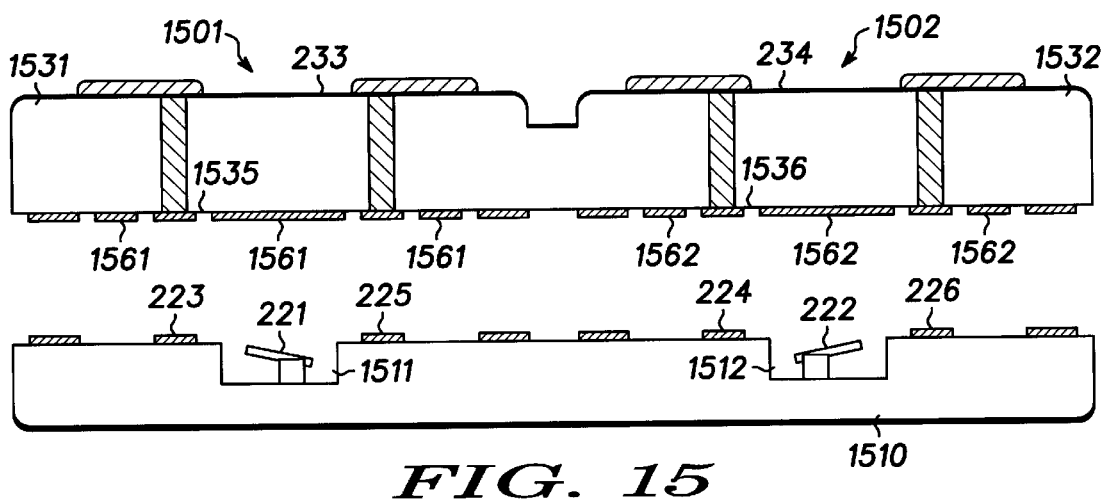
FIGS. 15 through 18 illustrate cross-sectional views of electronic components after different steps of yet another manufacturing process in accordance with yet another embodiment of the invention.

Continuing with FIG. 13, devices 221 and 222 are packaged or sealed between substrate 210 and caps 731 and 732. Then in FIG. 14, components 1101 and 1102 are singulated.

FIGS. 15 through 18 illustrate cross-sectional views of electronic components 1501 and 1502 after different steps of yet another manufacturing process. Components 1501 and 1502 are similar to components 701 and 702 of FIGS. 7 through 10. Components 1501 and 1502 include caps 1531 and 1532, respectively. Caps 1531 and 1532 are similar to caps 731 and 732, respectively, of FIG. 7. Caps 1531 and 1532, however, have inner surfaces 1535 and 1536, respectively, which are substantially planar. Accordingly, caps 1531 and 1532 also have EMI shields 1561 and 1562, respectively, which are shaped to fit the substantially planar contour of inner surfaces 1535 and 1536, respectively.

Components 1501 and 1502 are formed from different portions of substrate 1510. Substrate 1510 is similar to substrate 210 in FIG. 2. Substrate 1510 in FIG. 15, however, has cavities 1511 and 1512. Accordingly, the top surface of substrate 1510 is not substantially planar. Devices 221 and 222 are located within cavities 1511 and 1512, respectively.

Figure 16:
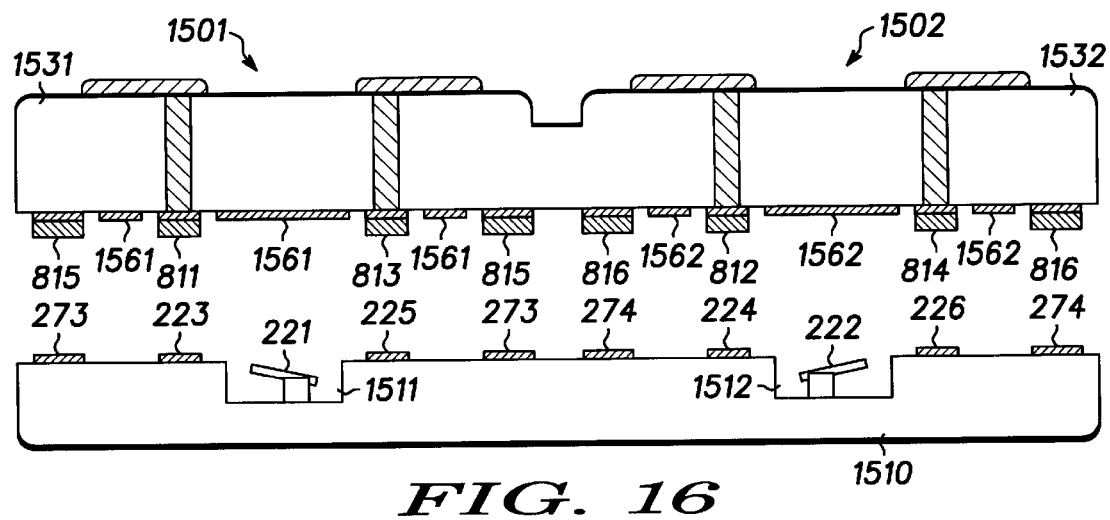
Figure 17:
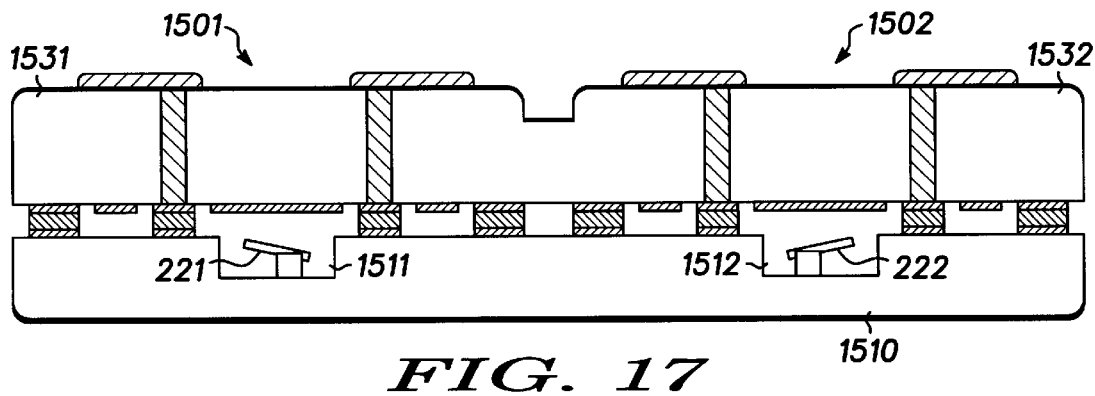
Figure 18:
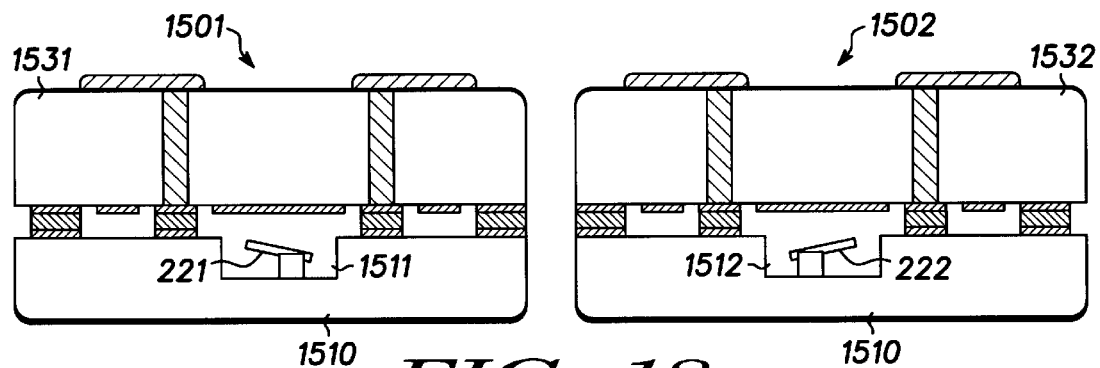
Figure 19:
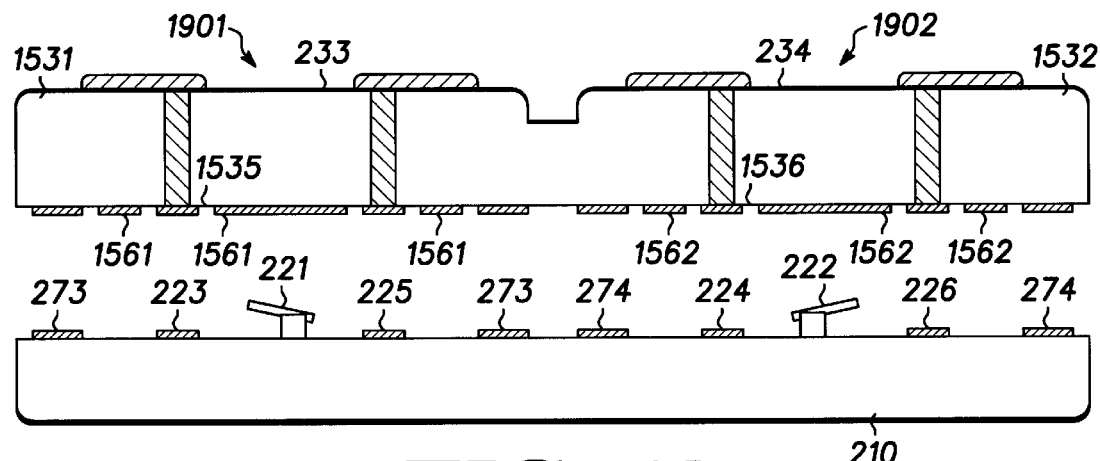
FIGS. 19 through 22 illustrate cross-sectional views of electronic components after different steps of still another manufacturing process in accordance with still another embodiment of the invention.

In FIG. 16, the electrically conductive material and the adhesive material are screen printed onto caps 1531 and 1532. Then, in FIG. 17, devices 221 and 222 are packaged or sealed between substrate 1510 and caps 1531 and 1532. Next, in FIG. 18, components 1501 and 1502 are singulated.

FIGS. 19 through 22 illustrate cross-sectional views of electronic components 1901 and 1902 after different steps of still another manufacturing process. Components 1901 and 1902 are similar to components 1501 and 1502 of FIGS. 15 through 18. Components 1901 and 1902 in FIGS. 19 through 22, however, have substrate 210, instead of substrate 1510. Without a cavity in the cap or the supporting substrate of components 1901 and 1902, the electrically conductive material and the adhesive material can have greater heights or thicknesses compared to that used for components 1501 and 1502 in FIGS. 15 through 18. The electrically conductive material and the adhesive material in components 1901 and 1902, however, still preferably have the same or similar heights or thicknesses compared to each other.

Figure 20:
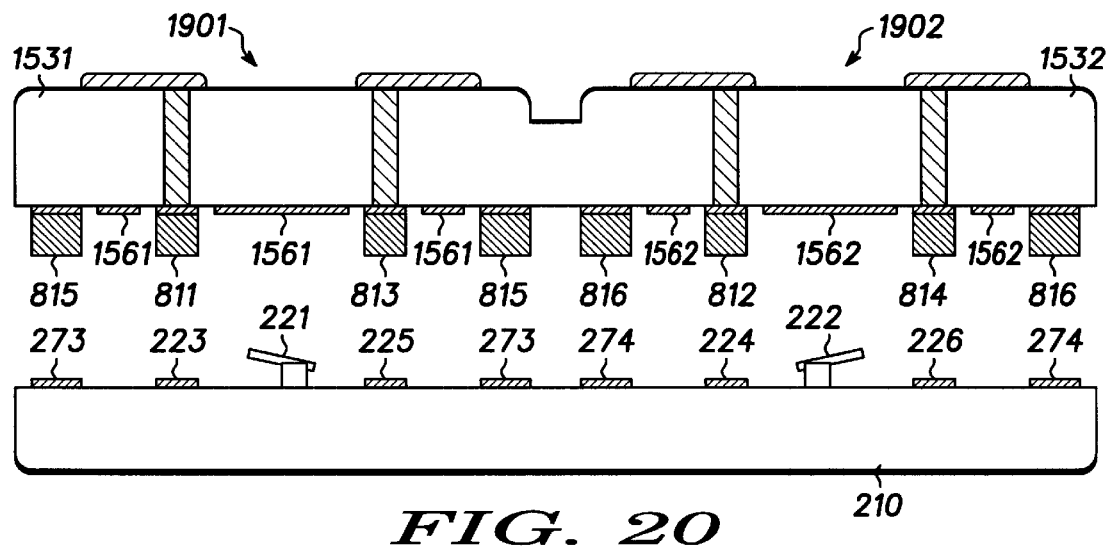
Figure 21:
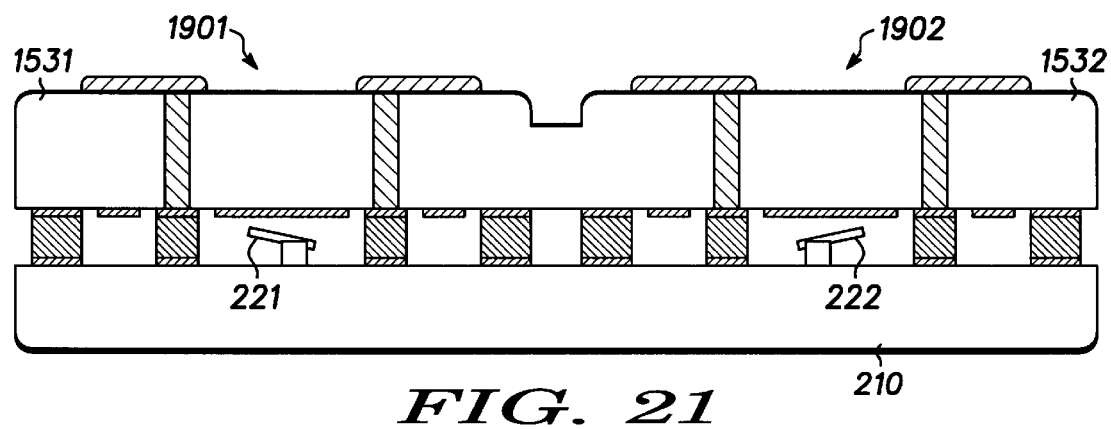
Figure 22:
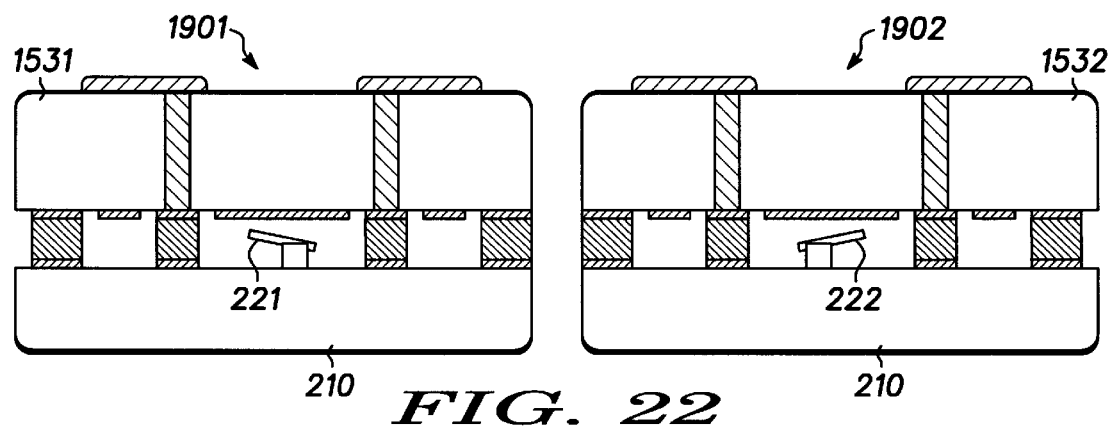

In FIG. 20, the electrically conductive material and the adhesive material is printed onto caps 1531 and 1532. Next, in FIG. 21, devices 221 and 222 are packaged or sealed between substrate 210 and caps 1531 and 1532. Then, in FIG. 22, components 1901 and 1902 are singulated.

Therefore, an electronic component and method of manufacture has been provided to overcome the disadvantages of the prior art. The electronic component can include a MEMS switch to provide low insertion loss and high RF isolation. The electronic component also has low parasitic inductances because of the elimination of wire bonds and the use of flip-chip interconnects. The electronic component also has a smaller package size and thickness and a reduced package material cost. The method of manufacturing the electronic component has high manufacturing throughput, minimal die damage, and accurate die alignment because of the use of wafer-level packaging.

Although the invention has been described with reference to specific embodiments, it will be understood by those skilled in the art that various changes may be made without departing from the spirit or scope of the invention. For instance, the numerous details set forth herein such as, for example, the material compositions and the specific inner surface configurations of the caps are provided to facilitate the understanding of the invention and are not provided to limit the scope of the invention. Furthermore, the different aspects of the different embodiments can be combined with each other. For example, all of the components can be modified to include more than one device, as illustrated in FIG. 6. Additionally, all of the components can be modified to include control and/or power circuitry, as illustrated in FIG. 6, that can be either in addition to or separate from the additional device or devices. Moreover, all of the embodiments can be modified to include a cavity in the lid and in the substrate. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. An electronic component comprising:
   a substrate;
   a device supported by the substrate and comprising a first bond pad; and
   a cap overlying the substrate and comprising:
   an outside surface facing away from the substrate;
   the inside surface facing towards the substrate;
   a second bond pad at the outside surface;
   a third bond pad at the inside surface and electrically coupled to the first bond pad; and
   an electrically conductive via extending through the cap and electrically coupling together the second and third bond pads.-

2. The electronic component of claim 1 further comprising:
an adhesive material located between the cap and the substrate to form a seal between the cap and the substrate.

3. The electronic component of claim 2 wherein:
the adhesive material is electrically conductive.

4. The electronic component of claim 2 wherein:
the adhesive material electrically couples together the first and third bond pads.

5. The electronic component of claim 4 wherein:
the inside surface of the cap is substantially planar.

6. The electronic component of claim 4 wherein:
the inside surface of the cap is non-planar.

7. The electronic component of claim 2 further comprising:
an electrically conductive material located between the first and third bond pads to electrically couple together the first and third bond pads.

8. The electronic component of claim 7 further comprising:
the adhesive material is wider than the electrically conductive material.

9. The electronic component of claim 1 wherein:
the inside surface of the cap is non-planar.

10. The electronic component of claim 9 further comprising:
an electrically conductive material located between the first and third bond pads to electrically couple together the first and third bond pads; and
an adhesive material located between the cap and the substrate to form a seal between the cap and the substrate,
wherein:
the electrically conductive material and the adhesive material have similar heights.

11. The electronic component of claim 9 further comprising:
an electrically conductive material located between the first and second bond pads to electrically couple together the first and second bond pads; and
an adhesive material located between the cap and the substrate to form a seal between the cap and the substrate,
wherein:
the electrically conductive material and the adhesive material have different heights.

12. The electronic component of claim 1 wherein:
the inside surface of the cap is substantially planar.

13. The electronic component of claim 12 further comprising:
an electrically conductive material located between the first and third bond pads to electrically couple together the first and third bond pads; and
an adhesive material located between the cap and the substrate to form a seal between the cap and the substrate,
wherein:
the electrically conductive material and the adhesive material have similar heights.

14. The electronic component of claim 12 further comprising:
an electrically conductive material located between the first and second bond pads to electrically couple together the first and second bond pads; and
an adhesive material located between the cap and the substrate to form a seal between the cap and the substrate,
wherein:
the electrically conductive material and the adhesive material have different heights.

15. The electronic component of claim 1 wherein:
the device is selected from the group consisting of a micromachined device, an integrated circuit, and a discrete transistor.

16. The electronic component of claim 1 further comprising:
a second device supported by the substrate and comprising a fourth bond pad,
wherein:
the cap further comprises:
a fifth bond pad at the inside surface of the cap and electrically coupled to the fourth bond pad.

17. An electronic component comprising:
a substrate;
a device supported by the substrate and comprising an electrically conductive flip-chip bond pad;
a cap overlying the substrate and comprising:
an electrically insulative material having an outside surface facing away from the substrate and an inside surface facing towards the substrate;
a first electrically conductive bond pad at the outside surface of the cap;
a second electrically conductive bond pad at the inside surface of the cap and overlying the electrically conductive flip-chip bond pad;
an electrically conductive via extending through the cap from the outside surface of the cap to the inside surface of the cap and electrically coupling together the first and second electrically conductive bond pads; and
an electro-magnetic interference shield at the inside surface of the cap and adjacent to the second electrically conductive bond pad; and
an electrically conductive material between the electrically conductive flip-chip bond pad and the second electrically conductive bond pad to electrically couple together the electrically conductive flip-chip bond pad and the second electrically conductive bond pad.

18. The electronic component of claim 17 wherein:
the electrically conductive material seals the device between the cap and the substrate.

19. The electronic component of claim 17 further comprising:
an adhesive material located between the substrate and the inside surface of the cap to seal the device between the cap and the substrate, the electrically conductive material located between the adhesive material and the device.

20. The electronic component of claim 19 wherein:
the inside surface of the cap is substantially planar.

21. The electronic component of claim 19 wherein:
the inside surface of the cap is non-planar.

22. The electronic component of claim 21 wherein:
the electrically conductive material and the adhesive material have similar heights.

23. The electronic component of claim 21 wherein:
the electrically conductive material and the adhesive material have different heights.

24. The electronic component of claim 19 wherein:

the adhesive material is wider than the electrically conductive material.

25. The electronic component of claim 17 further comprising:

a second device supported by the substrate and comprising an other electrically conductive flip-chip bond pad, wherein:

the cap further comprises:

a third electrically conductive bond pad at the outside surface of the cap;

a fourth electrically conductive bond pad at the inside surface of the cap, overlying the other electrically conductive flip-chip bond pad, and adjacent to the electro-magnetic interference shield;

an other electrically conductive via extending through the cap from the outside surface of the cap to the inside surface of the cap and electrically coupling together the third and fourth electrically conductive bond pads; and a first portion of the electrically conductive material is located between the electrically conductive flip-chip bond pad and the second electrically conductive bond pad to electrically couple together the electrically conductive flip-chip bond pad and the second electrically conductive bond pad; and a second portion of the electrically conductive material is located between the other electrically conductive flip-chip bond pad and the fourth electrically conductive bond pad to electrically couple together the other electrically conductive flip-chip bond pad and the fourth electrically conductive bond pad.

* * * * *